United States Patent
Ren et al.

(10) Patent No.: US 10,340,332 B2
(45) Date of Patent: Jul. 2, 2019

(54) FOLDED TERMINATION WITH INTERNAL FIELD PLATE

(71) Applicants: University of Electronic Science and Technology of China, Chengdu (CN); Institute of Electronic and Information Engineering of UESTC in Guangdong, Dongguan (CN)

(72) Inventors: Min Ren, Chengdu (CN); Yumeng Zhang, Chengdu (CN); Cong Di, Chengdu (CN); Jingzhi Xiong, Chengdu (CN); Zehong Li, Chengdu (CN); Jinping Zhang, Chengdu (CN); Wei Gao, Chengdu (CN); Bo Zhang, Chengdu (CN)

(73) Assignees: UNIVERSITY OF ELECTRONIC SCIENCE AND TECHNOLOGY OF CHINA, Chengdu (CN); INSTITUTE OF ELECTRONIC AND INFORMATION ENGINEERING OF UESTC IN GUANGDONG, Dongguan (CN)

( * ) Notice: Subject to any disclaimer, the term of this patent is extended or adjusted under 35 U.S.C. 154(b) by 0 days.

(21) Appl. No.: 15/774,286

(22) PCT Filed: Sep. 17, 2016

(86) PCT No.: PCT/CN2016/099163
§ 371 (c)(1),
(2) Date: May 8, 2018

(87) PCT Pub. No.: WO2018/049640
PCT Pub. Date: Mar. 22, 2018

(65) Prior Publication Data
US 2019/0067415 A1    Feb. 28, 2019

(51) Int. Cl.
H01L 29/06    (2006.01)
H01L 29/78    (2006.01)
H01L 29/40    (2006.01)

(52) U.S. Cl.
CPC ........ *H01L 29/0615* (2013.01); *H01L 29/407* (2013.01); *H01L 29/78* (2013.01); *H01L 29/7813* (2013.01)

(58) Field of Classification Search
CPC ...... H01L 29/407; H01L 29/408; H01L 29/41
See application file for complete search history.

(56) References Cited

U.S. PATENT DOCUMENTS

2010/0013552 A1*    1/2010    Darwish ............. H01L 29/7839
327/581

FOREIGN PATENT DOCUMENTS

| CN | 101894865 A | 11/2010 |
| CN | 102254931 A | 11/2011 |

(Continued)

*Primary Examiner* — Quoc D Hoang
(74) *Attorney, Agent, or Firm* — Gokalp Bayramoglu

(57) ABSTRACT

A junction termination with an internal field plate, the field plate structure and the junction termination extension region are folded inside the device to make full use of the thickness of the drift region in the body, thereby reducing the area of the termination and relieving the electric field concentration at the end of the PN junction. The breakdown position is transferred from the surface into the body of the original PN junction, and the withstand voltage of termination can reach to the breakdown voltage of the parallel plane junction. Under such design, a smaller area can be obtained than that of the conventional structure at the same withstand voltage.

20 Claims, 15 Drawing Sheets

(56) References Cited

FOREIGN PATENT DOCUMENTS

| | | | |
|---|---|---|---|
| CN | 103094324 | A | 5/2013 |
| CN | 104992976 | A | 10/2015 |
| CN | 105047721 | A | 11/2015 |
| CN | 105932051 | A | 9/2016 |
| WO | 2016042330 | A1 | 3/2016 |

\* cited by examiner

FOLDED TERMINATION WITH INTERNAL FIELD PLATE

CROSS REFERENCE TO RELATED APPLICATIONS

This application is the national phase entry of International Application No. PCT/CN2016/099163, filed on Sep. 17, 2016, the entire contents of which are incorporated herein by reference.

TECHNICAL FIELD

The present invention relates to the field of semiconductor technology, and more particularly to a folded termination with internal field plate.

BACKGROUND

The ability of a power device to sustain high voltage depends primarily on the reverse breakdown voltage of the particular PN junctions in the device structure. All semiconductor devices are limited by size. When the wafer is cut into chips and packaged to make devices, the crystal lattice of the silicon wafer gets greatly damaged. For power devices, if the cut passes through the device structure that is subject to high voltage, lattice damages can cause a large leakage current, which reduces the breakdown voltage and long-term reliability of the device. In power devices, affected by the non-ideal surface of the PN junction or the termination of the PN junction, the reverse breakdown voltage of PN junction is also influenced by the breakdown phenomenon that the local area near the surface or at the bend of junction is occurred earlier than that of the parallel plane junction in the body. The junction termination is a special structure designed to reduce the local electric field, improve the surface breakdown voltage and reliability, and make the actual breakdown voltage of the device closer to the ideal value of the parallel plane junction. In the vertical conductive device, the junction termination is usually distributed in the vicinity of the active region of the device, and is an auxiliary structure of the PN junction in the active region for receiving external high voltage.

At present, the junction termination structure of the power semiconductor device fabricated by planar process is usually provided with some extended structures at the edge of the main junction (usually curved). These extended structures, such as field plate (FP), field limiting ring (FLR) and junction termination extension (JTE), variation of lateral doping (VLD) and resistive field plate (such as Semi-Insulating Polysilicon (SIPOS)), RESURF, actually play the role of widening the depletion region of the main junction, thereby reducing the electric field and ultimately increasing the breakdown voltage. To achieve high breakdown voltage, the extended structures must be long enough to ensure the full expansion of the main junction's depletion region. Therefore, in the high-voltage devices, the existing extended type termination structures occupy too much area, resulting in an increase in device costs.

SUMMARY

In order to solve the above problems, a junction termination with internal field plate is provided in the present invention, which can achieve a smaller area compared with a conventional one with the same breakdown voltage.

According to an aspect of the present invention, a junction termination with an internal field plate includes: a heavily doped substrate of a first conductive type semiconductor, a lightly doped drift region of the first conductive type semiconductor on an upper surface of the heavily doped substrate of the first conductive type semiconductor, and a metal drain electrode on a lower surface of the heavily doped substrate of the first conductive type semiconductor; the lightly doped drift region of the first conductive type semiconductor is provided with a trench, and the trench is located in a middle of the lightly doped drift region of the first conductive type semiconductor and extends downwardly into the lightly doped drift region of the first conductive type semiconductor along an upper surface of the lightly doped drift region of the first conductive type semiconductor; the trench is filled with insulating dielectric; the upper surface of the lightly doped drift region of the first conductive type semiconductor is provided with a field oxide layer; a side of the trench near an active region of a device is provided with a first semiconductor implantation region, and the first semiconductor implantation region is respectively connected to a main junction of a second conductive type semiconductor of the active region and the trench, and an upper surface of the first semiconductor implantation region is in contact with a field oxide layer, a lower surface of the first semiconductor implantation region is in contact with a second semiconductor implantation region, a side surface of the second semiconductor implantation region is in contact with the trench; the first semiconductor implantation region and the second semiconductor implantation region are both a second conductive type semiconductor, and a concentration of the first semiconductor implantation region is greater than that of the second semiconductor implantation region; an end of the upper surface of the lightly doped drift region of the first conductive type semiconductor, distant from the active region of the device, is provided with a heavily doped region of the first conductive type semiconductor, an upper surface of the heavily doped region of the first conductive type semiconductor is in contact with the field oxide layer; an upper surface of the field oxide layer is provided with a polysilicon layer; a polysilicon field plate is in the trench, and an upper surface of the polysilicon plate is in contact with the polysilicon layer.

According to another aspect of the present invention, the polysilicon field plate has an inverted trapezoidal shape in a cross-sectional view of the device, and a junction depth of a lower bottom of the polysilicon field plate is larger than that of the second semiconductor implantation region; a value of angle θ between a side of the polysilicon field plate and a horizontal line is in a range of 60° to 70°.

According to a further aspect of the present invention, a buried layer of the second conductive type semiconductor is provided directly under trench.

According to a further aspect of the present invention, a lower surface of the trench extends into the heavily doped substrate of the first conductive type semiconductor.

According to a further aspect of the present invention, under the second semiconductor implantation region, a plurality of semiconductor doped regions with successively lower doping levels are provided along side walls of the trench.

According to a further aspect of the invention, in the active region of the device, the main junction of the second conductive type semiconductor in contact with the first semiconductor implantation region is arranged on an upper layer of the lightly doped drift region of the first conductive type semiconductor; an upper surface of the main junction of the second conductive type semiconductor, distant from a termination region, is provided with a source metal, and the source metal is in contact with the field oxide layer.

According to a further aspect of the invention, the main junction of the second conductive type semiconductor is in contact with the polysilicon layer through a contact hole.

According to a further aspect of the invention, the source metal extends along the upper surface of the field oxide layer to connect with the polysilicon layer, and connects a potential of a source to the polysilicon field plate.

Further, a buried layer of the second conductive type semiconductor is provided directly under the trench.

Compared to the conventional structure, the present invention has the following advantages:

In the present invention, the field plate structure and the junction terminal expansion region are folded inside the device, and the thickness of the drift region in the body can be fully utilized, thereby narrowing the lateral area of the termination and relieving the electric field concentration at the end of the PN junction. The breakdown position is transferred from the end into the body of the original PN junction, and the withstand voltage of termination can reach to the breakdown voltage of the parallel plane junction. Thus, the efficiency of the junction termination with internal field plate in the present invention is much higher than that of the conventional junction terminal extension structure.

DETAILED DESCRIPTION

In the following detailed description, the features of the various exemplary embodiments may be understood accompanying with the drawings.

Embodiment 1

Figure 1:
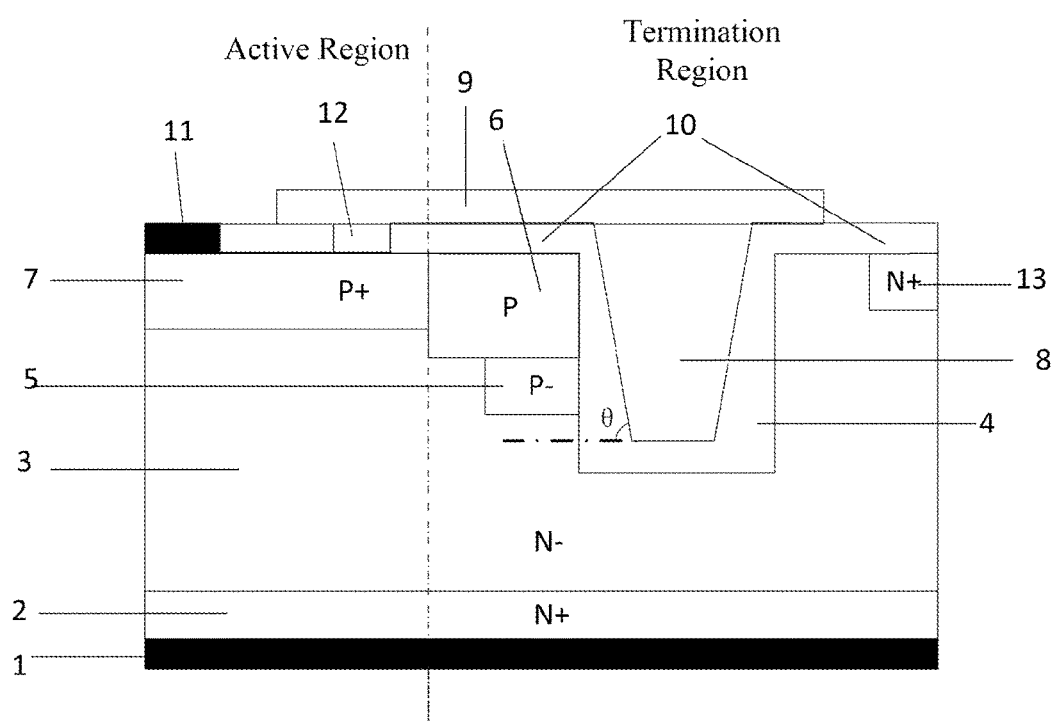
FIG. 1 is a schematic diagram of Embodiment 1.

As shown in FIG. 1, a junction termination with internal field plate includes: a heavily doped substrate of a first conductive type semiconductor 2, a lightly doped drift region of the first conductive type semiconductor 3 located on the upper surface of the heavily doped substrate of the first conductive type semiconductor 2, and a metal drain electrode 1 located on the lower surface of the heavily doped substrate of the first conductive type semiconductor 2; the lightly doped drift region of the first conductive type semiconductor 3 is provided with a trench 4, and the trench 4 is located in the middle of the lightly doped drift region of the first conductive type semiconductor 3 and extends vertically into the lightly doped drift region of the first conductive type semiconductor 3 along the upper surface of the lightly doped drift region of the first conductive type semiconductor 3. The trench 4 is filled with insulating dielectric. The upper surface of the lightly doped drift region of the first conductive type semiconductor 3 is provided with a field oxide layer 10; a side of the trench 4 near an active region of a device is provided with a first semiconductor implantation region 6, and the first semiconductor implantation region 6 is respectively connected to a main junction of a second conductive type semiconductor 7 of the active region and the trench 4, and the upper surface of the first semiconductor implantation region 6 is in contact with the field oxide layer 10, the lower surface of the first semiconductor implantation region 6 is in contact with the second semiconductor implantation region 5, the side surface of the second semiconductor implantation region 5 is in contact with the trench 4. The first semiconductor implantation region 6 and the second semiconductor implantation region 5 are both the second conductive type semiconductor, and the concentration of the first semiconductor implantation region 6 is greater than that of the second semiconductor implantation region 5. An end of the upper surface of the lightly doped drift region of the first conductive type semiconductor 3, distant from the active region of the device, is provided with a heavily doped region of the first conductive type semiconductor 13. The upper surface of the heavily doped region of the first conductive type semiconductor 13 is in contact with the field oxide layer 10. The upper surface of the field oxide layer 10 is provided with a polysilicon layer 9. A polysilicon field plate 8 is in the trench 4, and the upper surface of the polysilicon plate 8 is in contact with the polysilicon layer 9. The polysilicon field plate 8 has an inverted trapezoidal shape in the cross-sectional view of the device, and the junction depth of the lower bottom edge of the polysilicon field plate 8 is larger than that of the second semiconductor implantation region 5. The value of the angle θ between the side of the polysilicon field plate 8 and the horizontal line is in the range of 60° to 70°.

The working principle and manufacturing method of embodiment 1 will be described by taking the first conductive type semiconductor as the P-type semiconductor as an example.

Figure 2:
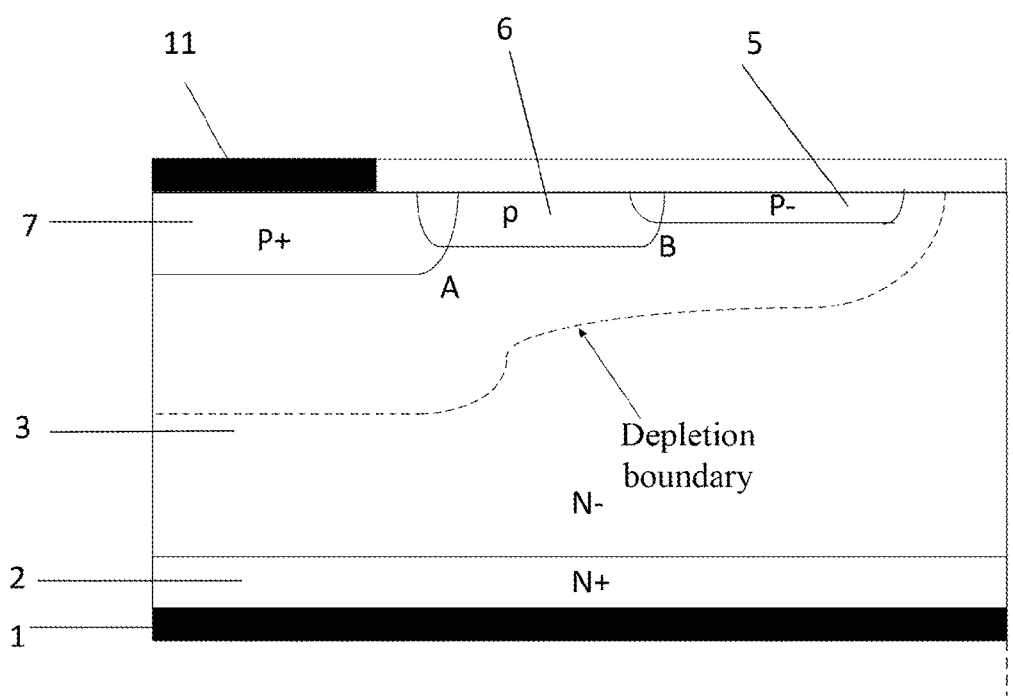
FIG. 2 is a schematic diagram of a depletion line when a high voltage is applied to a drain of a conventional planar junction expansion structure.

FIG. 2 shows a conventional planar junction termination expansion structure. When the power device is in the reverse blocking state, the drain metal 1 is on the positive bias, and the source metal 11 is on the zero potential. The electric field directs from the first conductive type semiconductor lightly doped region 3 to the main junction 7 of the second conductive type semiconductor material, the first lightly doped region 6 of the second conductive type semiconductor material, and the second lightly doped region 5 of the second conductive type semiconductor material. This structure can greatly improve the electric field concentration at the edge of the main junction 7 and increase the breakdown voltage. However, since the first lightly doped regions 6 of the second conductive type semiconductor material and the second lightly doped regions 5 of the second conductive type semiconductor material are both developed on the semiconductor surface, a larger area is required.

In this embodiment, a trench is dug on the side surface of the main junction 7 of the second conductive type semiconductor material. And a second conductive type implantation region 6 and a second conductive type implantation region 5 with successively lowering doping concentrations are formed on the side of the trench. The termination extension region is transferred from the surface to the body, and the terminal electric field is expanded by using the thickness of the lightly doped drift region of the first conductive type semiconductor 3, thereby effectively saving the surface area. The second conductive type implantation region 6 and the second conductive type implantation region 5 constitute a junction termination extension (JTE) region. If the quantity of charges in the JTE area is too small, the influence of JTE region on the electric field of main junction is limited. If the quantity of charges in the JTE area is too large, the curvature radius of the depletion region is too small, and the breakdown voltage will be reduced. Therefore, the charges in the JTE region should be completely depleted by the reverse bias.

At the same time, the trench region 4 is dug and filled with polysilicon as the field plate, and the bottom edge of the field plate exceeds the lower surface of the lightly doped region 5 of the second conductive type semiconductor material, and the field plate are connected to the main junction of the second conductive type semiconductor 7 through the polysilicon. Thus, the field plate and the main junction of the second conductive type semiconductor 7 have the same potentials, which can further extend the boundary of the depletion region inside the first conductive type semiconductor lightly doped region 3. Another advantage of the field plate is that it can shield the charge in the oxide layer from affecting the terminal electric field. Additional charge can be easily brought in trench etching and field oxygen growth processes. The reliability of the terminal structure proposed by the present invention can also be improved by the field plate.

In the conventional field plate structure, a large electric field peak appears at the end of the field plate, because the potential difference across the oxide layer at the end of the field plate is the largest when the thickness of the oxide layer is constant. In order to reduce the electric field at the end of the field plate, in this invention, the polysilicon field plate 8 has an inverted trapezoidal shape, which makes the thickness of the silicon dioxide layer in the longitudinal direction gradually increase from the surface to the body of the lightly doped drift region of the first conductive type semiconductor 3, and ensures that the electric field at the end of the field plate is not too large to result in early breakdown. The angle θ between the sidewall of the polysilicon field plate 8 and the horizon is a key parameter. On the one hand, an excessively large angle makes the increase of the thickness of the silicon dioxide layer unnoticeable, that is, the effect of slowing the electric field at the end of the field plate is not obvious; on the other hand, an excessively small angle makes the terminal area too large, easily causing unnecessary waste. In summary, the value of θ is better between 60° and 70°.

Figure 3:
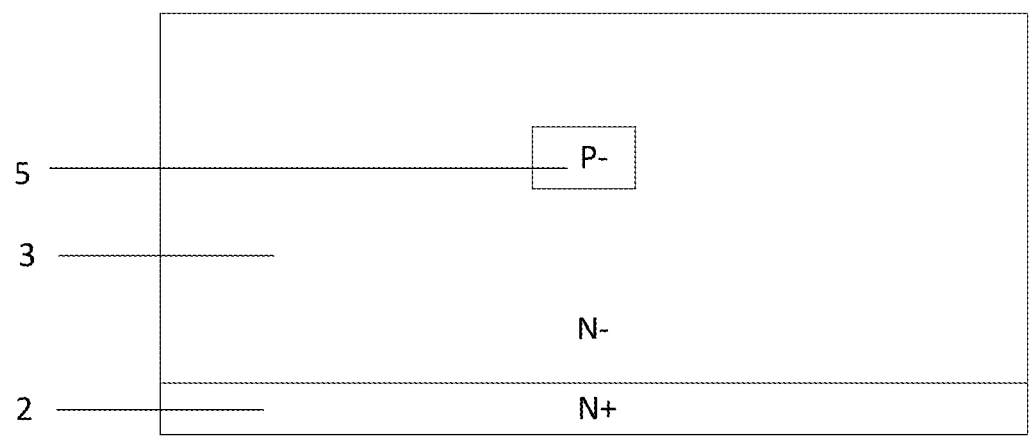
FIG. 3 is a cross-sectional view of a second lightly doped region 5 of a second conductive type semiconductor material after high energy ion implantation in a manufacturing process of Embodiment 1.
Figure 4:
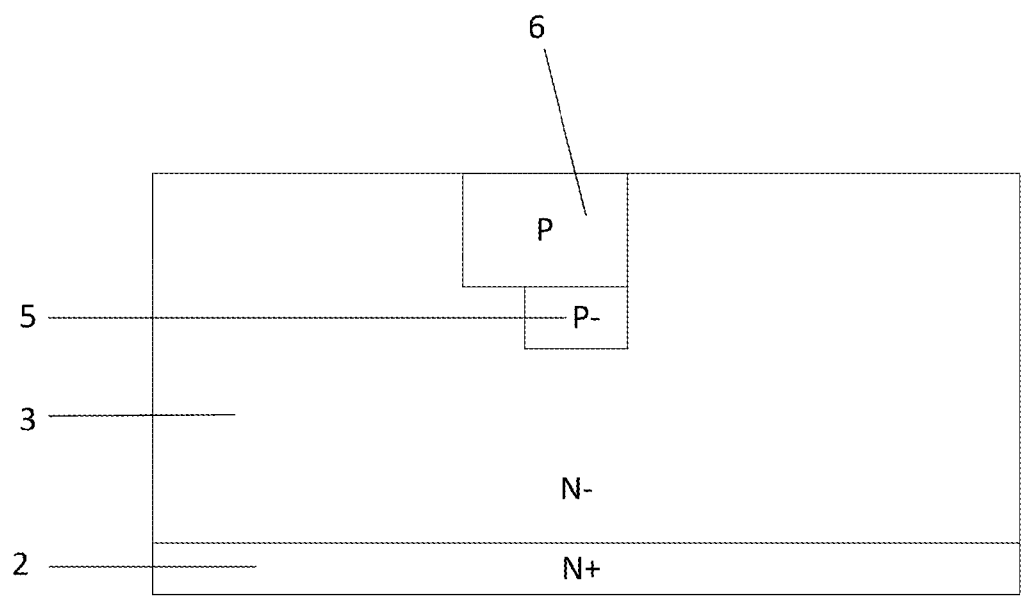
FIG. 4 is a cross-sectional view of a first lightly doped region 6 of a second conductive type semiconductor material after ion implantation in the manufacturing process of Embodiment 1.
Figure 5:
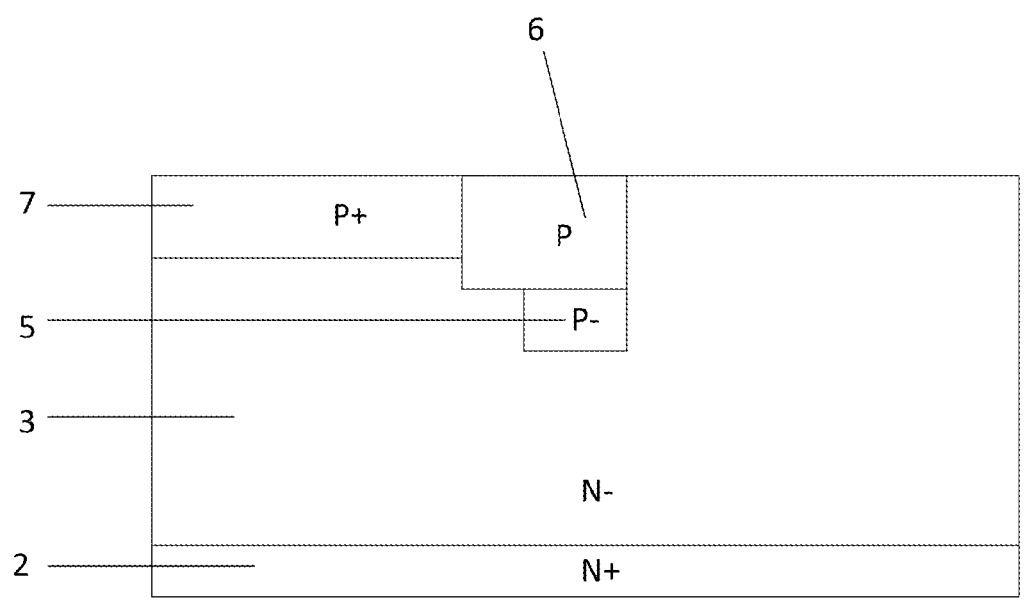
FIG. 5 is a cross-sectional view of a main junction 7 of a second conductive type semiconductor material after ion implantation in an active region in a manufacturing process of Embodiment 1.
Figure 6:
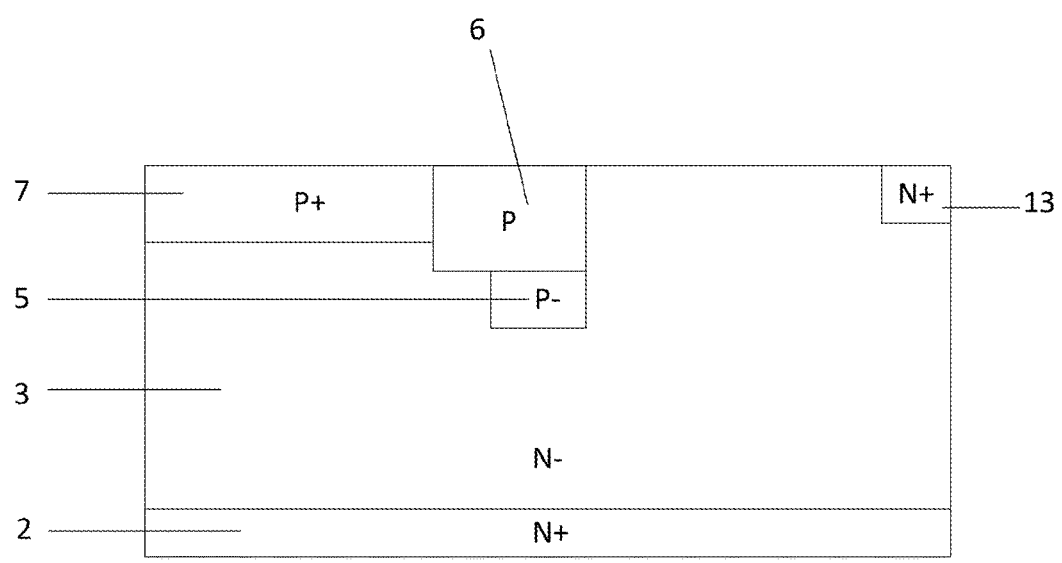
FIG. 6 is a cross-sectional view of a heavily doped region 13 of a first conductive type semiconductor material after ion implantation in a terminal region in a manufacturing process of Embodiment 1.
Figure 7:
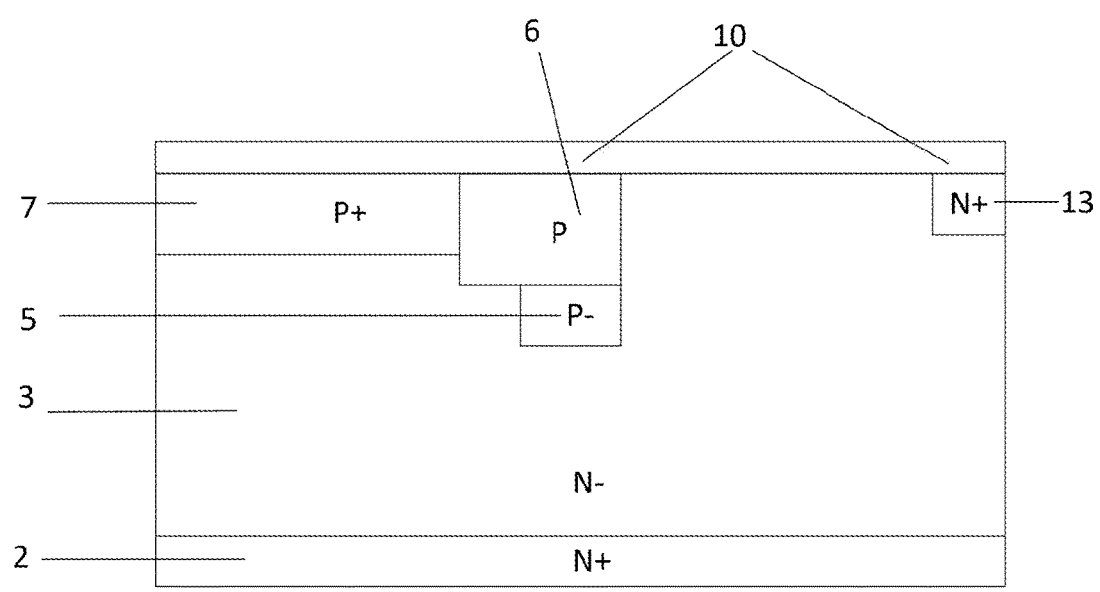
FIG. 7 is a cross-sectional view of a field oxide layer grown on a surface of the device in the manufacturing process of Example 1.
Figure 8:
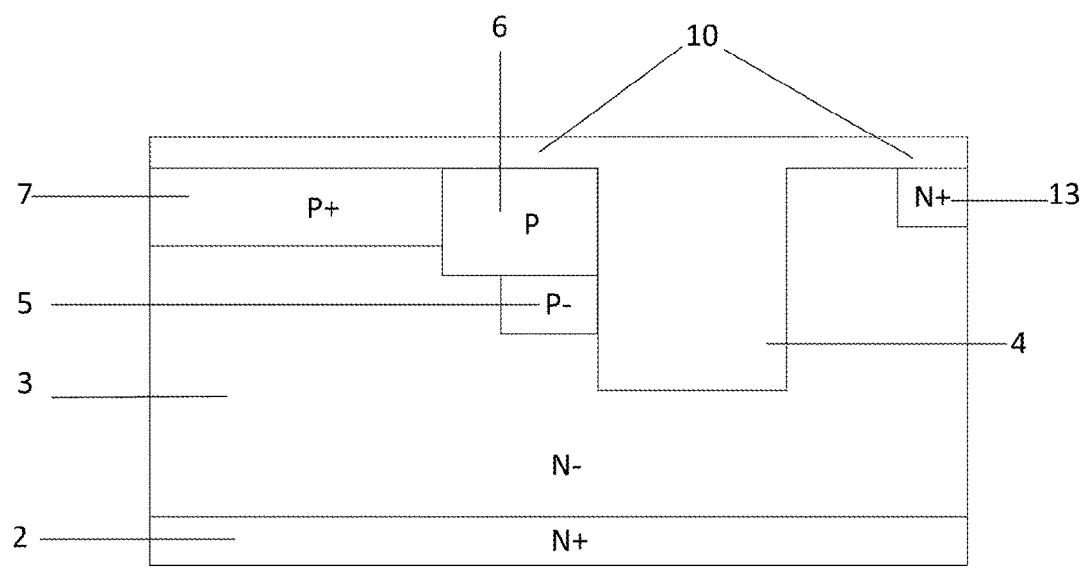
FIG. 8 is a cross-sectional view showing a trench filled with dielectric after being etched in a terminal region in the manufacturing process of Embodiment 1.
Figure 9:
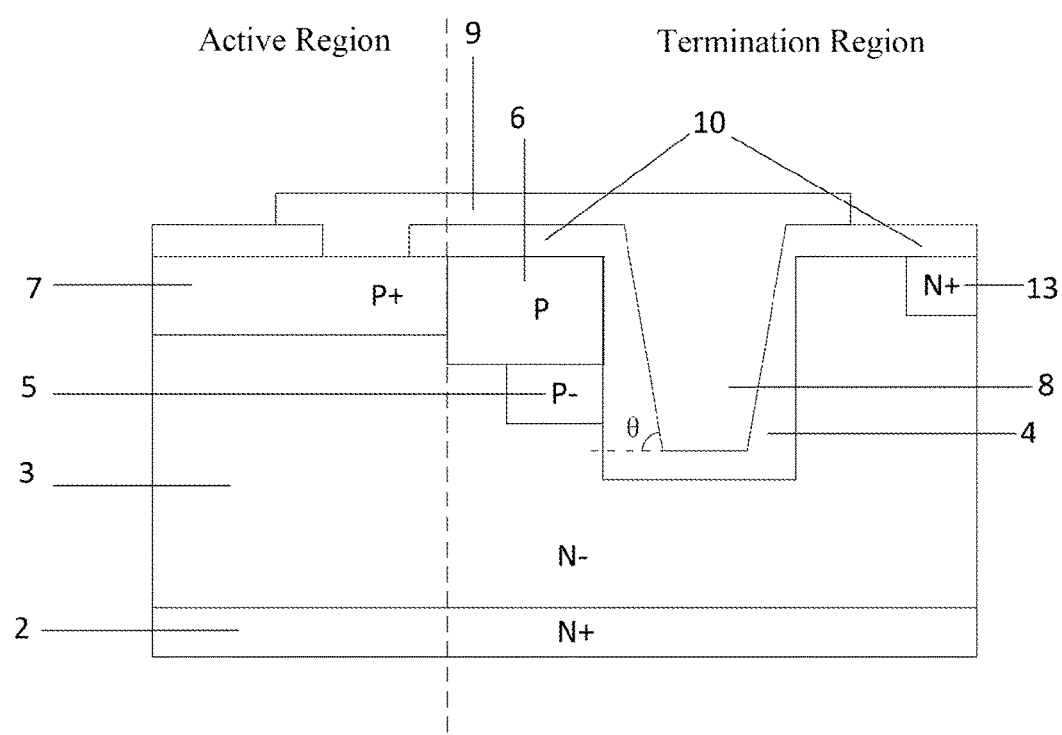
FIG. 9 is a cross-sectional view showing an inverted trapezoidal trench etched in a terminal region while etching an oxide layer on an upper surface of a second conductive type semiconductor material main junction 7 in the active region and depositing polysilicon in a trench and on a surface of the device in the manufacturing process of Embodiment 1.

The manufacturing process of Embodiment 1 is as follows:
(1) epitaxially growing a drift region of N-doping concentration on an N+ substrate, and then growing a thin layer of preoxidation layer on the surface of the wafer;
(2) forming the second lightly doped region 5 of the second conductive type semiconductor in the terminal region by high energy ion implantation, as shown in FIG. 3;
(3) forming the first lightly doped region 6 of the second conductive type semiconductor material in the terminal region by photolithography and ion implantation, and then contacting the first lightly doped region 6 with the second lightly doped region 5 by a high temperature process; then bonding the impurity atoms to the silicon atoms in the crystal lattice after high temperature activation, as shown in FIG. 4;
(4) forming the main junction 7 of the second conductive type semiconductor material by photolithography in the active region and ion implantation; driving the main junction 7 of the p-type semiconductor material to a certain junction depth through the thermal propulsion process, and then performing a high temperature activation, as shown in FIG. 5;
(5) forming the heavily doped region 8 of the first conductive type semiconductor material by photolithography and ion implantation in the terminal region, as shown in FIG. 6;
(6) growing the oxide layer 10 on the wafer surface as shown in FIG. 7;
(7) etching a rectangular trench 4 in the terminal region and filling the trench with dielectric as shown in FIG. 8;
(8) etching the inverted trapezoidal trench in the terminal region, and etching the oxide layer on the surface of the main junction 7 of the second conductive type semiconductor material in the active region at the same time; depositing the polysilicon in the trench and on the surface of the device, as shown in FIG. 9;
(9) etching a contact hole and forming a P+ contact area in the contact hole by low-energy high-dose boron ion implantation, depositing metal layer and carving the metal layer to form the source electrode; thinning the back of the wafer and forming a drain metal by metallization, as shown in FIG. 1.

Embodiment 2

Figure 10:
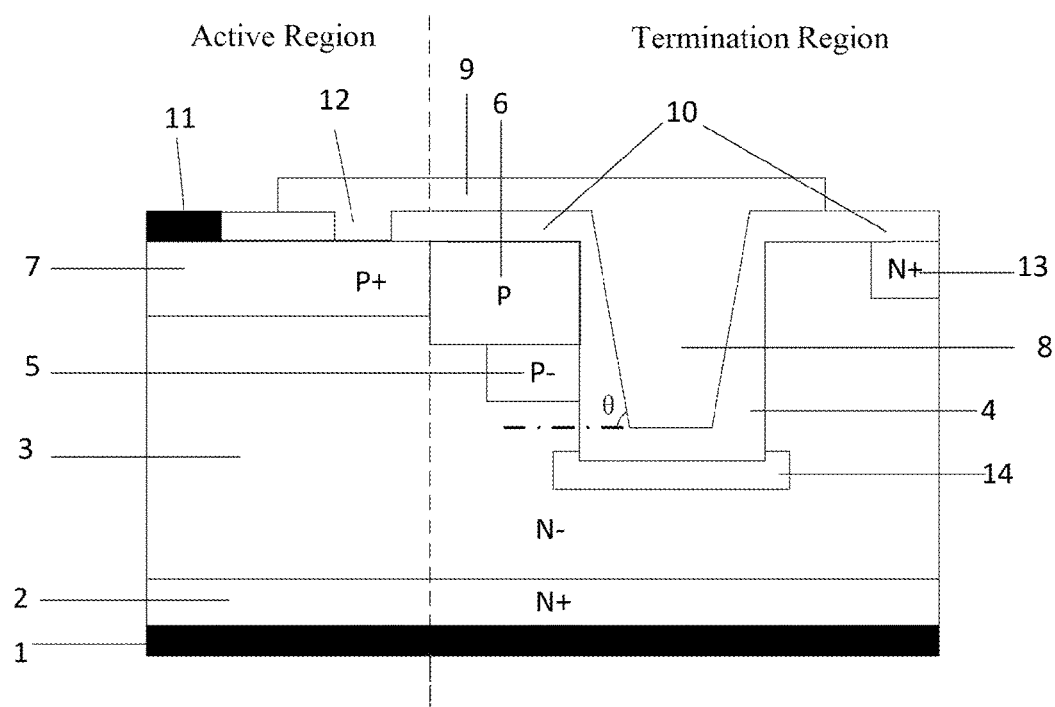
FIG. 10 is a schematic diagram of Embodiment 2.

As shown in FIG. 10, the structure of this embodiment is based on the structure of Embodiment 1, a buried layer 14 of the second conductive type semiconductor material is directly under the trench 4, and the electric field concentration at the corner of the trench can be reduced and the breakdown voltage can be further improved.

Embodiment 3

Figure 11:
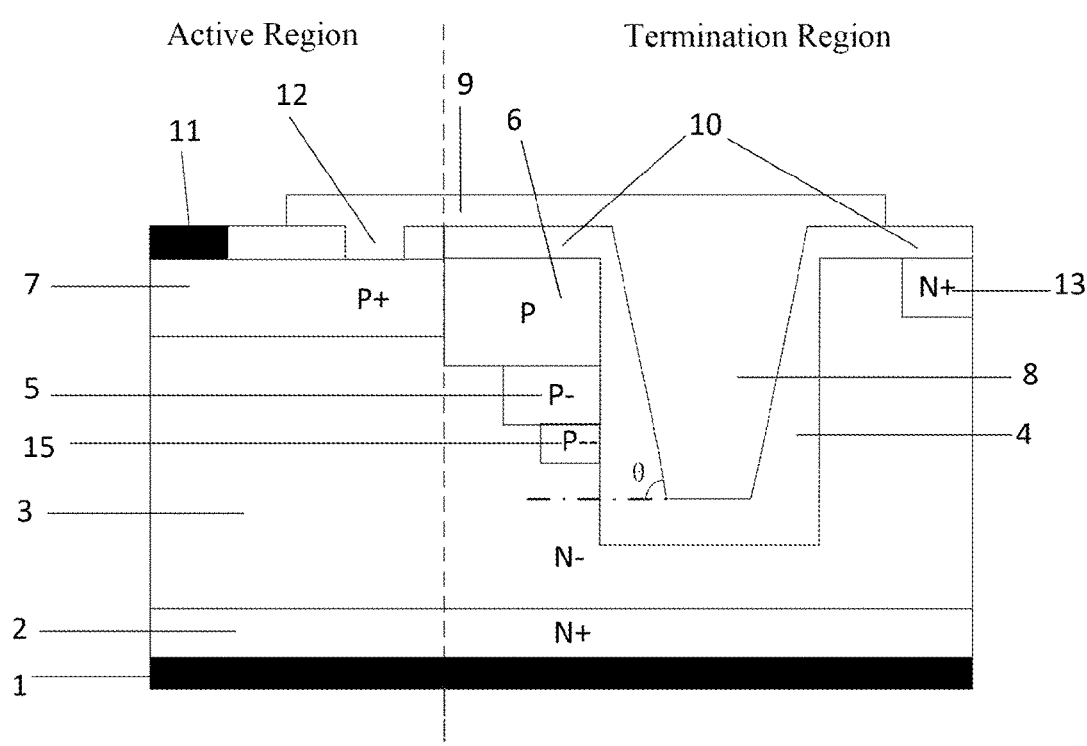
FIG. 11 is a schematic diagram of Embodiment 3.

As shown in FIG. 11, the structure of this embodiment is based on the structure of Embodiment 1, a lightly doped region 15 of the second conductive type with a lower dopant concentration is further formed along the side wall directly below the second conductive type implantation region 5, which can enhance the effect of JT E.

Embodiment 4

Figure 12:
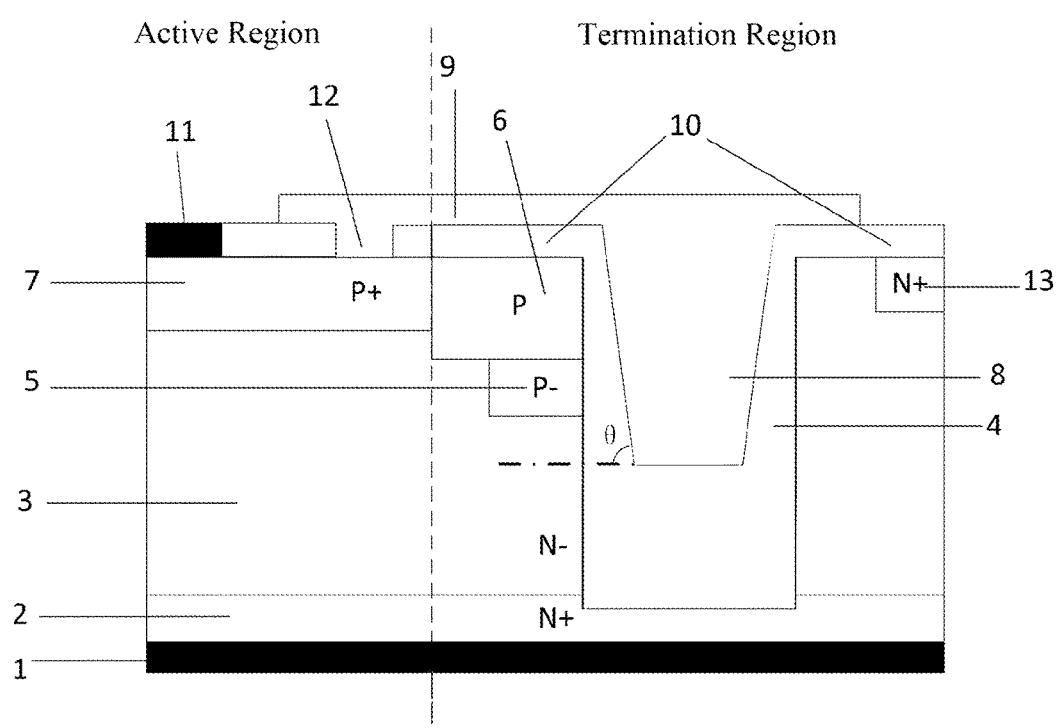
FIG. 12 is a schematic diagram of Embodiment 4.

As shown in FIG. 12, the structure of this embodiment is based on the structure of Embodiment 1, the trench 4 is dug into the body of the heavily doped region of the first conductive type semiconductor 2, and the withstand voltage is increased by increasing the thickness of the dielectric layer.

Embodiment 5

Figure 13:
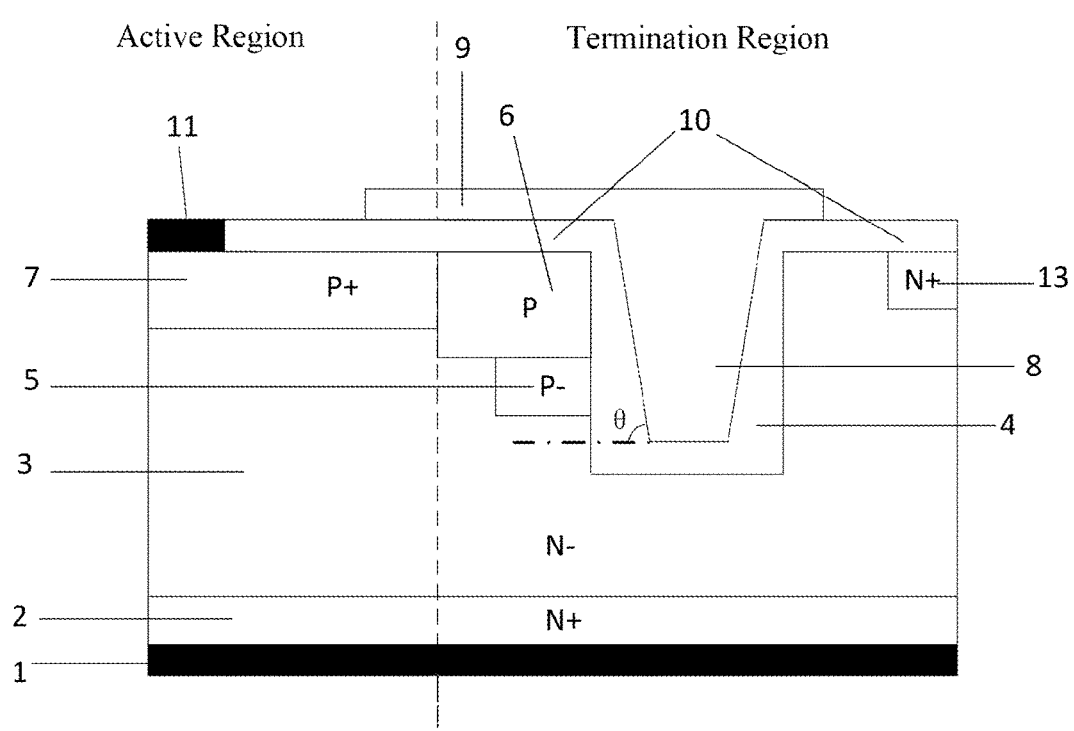
FIG. 13 is a schematic diagram of Embodiment 5.

As shown in FIG. 13, the structure of this embodiment is based on the structure of Embodiment 1, the polysilicon field plate is not connected with the main junction of the second conductive type semiconductor 7, that is, the polysilicon is a floating field plate.

Embodiment 6

Figure 14:
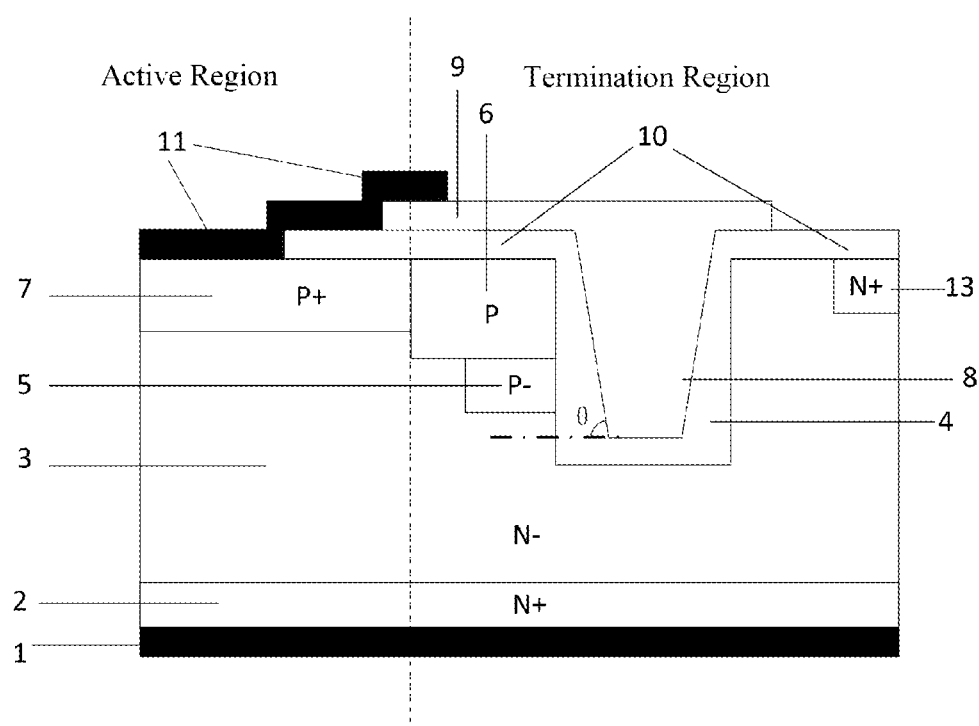
FIG. 14 is a schematic diagram of Embodiment 6.

As shown in FIG. 14, the structure of this embodiment is based on the structure of Embodiment 1, the source metal 11 is connected to the polysilicon through the contact hole, the potential of the source is connected to the polysilicon field plate.

Embodiment 7

Figure 15:
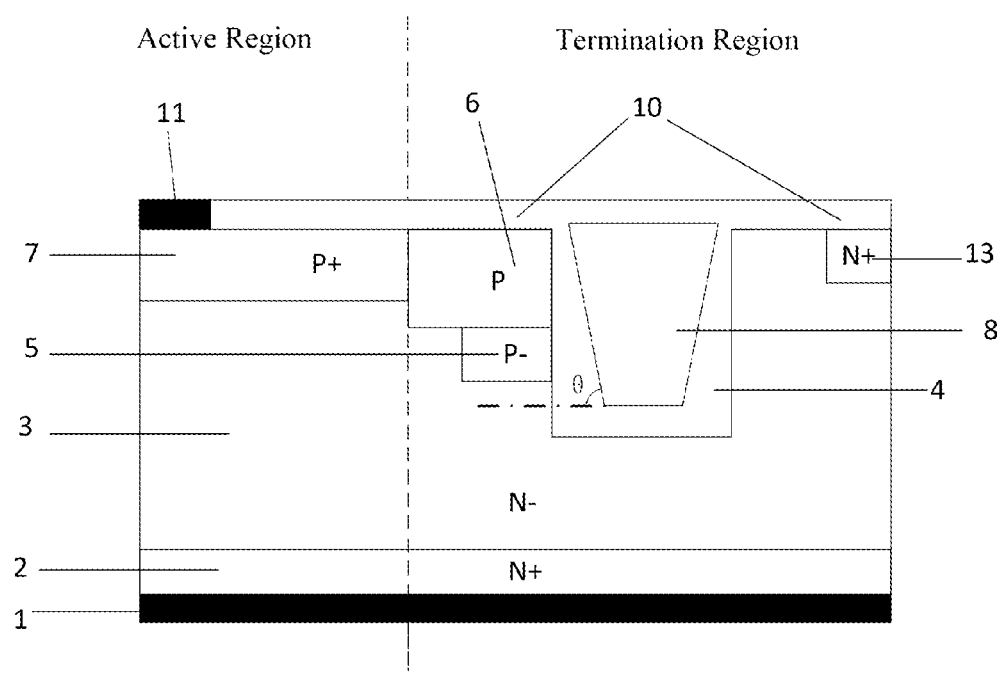
FIG. 15 is a schematic diagram of Embodiment 7.

As shown in FIG. 15, the structure of this embodiment is based on the structure of Embodiment 1, an oxide layer is deposited on the polysilicon field plate 8 and the polysilicon field plate is floating.

In the above embodiments, the silicon can be replaced with other semiconductor materials such as silicon carbide, gallium arsenide, indium phosphide or germanium silicon.

We claim:

1. A junction termination with an internal field plate comprising: a heavily doped substrate of a first conductive type semiconductor, a lightly doped drift region of the first conductive type semiconductor on an upper surface of the heavily doped substrate of the first conductive type semiconductor, and a metal drain electrode on a lower surface of the heavily doped substrate of the first conductive type semiconductor; wherein the lightly doped drift region of the first conductive type semiconductor is provided with a trench, and the trench is located in a middle of the lightly doped drift region of the first conductive type semiconductor and extends vertically downward into the lightly doped drift region of the first conductive type semiconductor along an upper surface of the lightly doped drift region of the first conductive type semiconductor, the trench is filled with insulating dielectric; the upper surface of the lightly doped drift region of the first conductive type semiconductor is provided with a field oxide layer; a side of the trench near an active region of a device is provided with a first semiconductor implantation region, and the first semiconductor implantation region is respectively connected to a main junction of a second conductive type semiconductor of the active region and the trench, and an upper surface of the first semiconductor implantation region is in contact with the field oxide layer, a lower surface of the first semiconductor implantation region is in contact with a second semiconductor implantation region, a side of the second semiconductor implantation region is in contact with the trench; the first semiconductor implantation region and the second semiconductor implantation region are both the second conductive type semiconductor, and a concentration of the first semiconductor implantation region is greater than a concentration of the second semiconductor implantation region; an end of the upper surface of the lightly doped drift region of the first conductive type semiconductor, distant from the active region of the device, is provided with a heavily doped region of the first conductive type semiconductor, an upper surface of the heavily doped region of the first conductive type semiconductor is in contact with the field oxide layer; an upper surface of the field oxide layer is provided with a polysilicon layer; a polysilicon field plate is in the trench, and an upper surface of the polysilicon field plate is in contact with the polysilicon layer.

2. The junction termination with the internal field plate according to claim 1, wherein the polysilicon field plate has an inverted trapezoidal shape in a cross-sectional view of the device, and a junction depth of a lower bottom edge of the polysilicon field plate is larger than a junction depth of the second semiconductor implantation region, a value of angle θ between a side of the polysilicon field plate and a horizontal line is in a range of 60° to 70°.

3. The junction termination with the internal field plate according to claim 2, wherein a buried layer of the second conductive type semiconductor is provided directly under the trench.

4. The junction termination with the internal field plate according to claim 3, wherein in the active region of the device, the main junction of the second conductive type semiconductor in contact with the first semiconductor implantation region is arranged on an upper layer of the lightly doped drift region of the first conductive type semiconductor; an upper surface of the main junction of the second conductive type semiconductor, distant from a termination region, is provided with a source metal, and the source metal is in contact with the field oxide layer.

5. The junction termination with the internal field plate according to claim 4, wherein the main junction of the second conductive type semiconductor is in contact with the polysilicon layer through a contact hole.

6. The junction termination with the internal field plate according to claim 5, wherein the source metal extends along the upper surface of the field oxide layer to connect with the polysilicon layer, and connects a potential of a source to the polysilicon field plate.

7. The junction termination with the internal field plate according to claim 2, wherein a lower surface of the trench extends into the heavily doped substrate of the first conductive type semiconductor.

8. The junction termination with the internal field plate according to claim 7, wherein under the second semiconductor implantation region, a plurality of semiconductor doped regions with successively lower doping levels are provided along a plurality of side walls of the trench.

9. The junction termination with internal field plate according to claim 8, wherein a buried layer of the second conductive type semiconductor is provided directly under the trench.

10. The junction termination with the internal field plate according to claim 8, wherein in the active region of the device, the main junction of the second conductive type semiconductor in contact with the first semiconductor implantation region is arranged on an upper layer of the lightly doped drift region of the first conductive type semiconductor; an upper surface of the main junction of the second conductive type semiconductor, distant from a termination region, is provided with a source metal, and the source metal is in contact with the field oxide layer.

11. The junction termination with the internal field plate according to claim 7, wherein in the active region of the device, the main junction of the second conductive type semiconductor in contact with the first semiconductor implantation region is arranged on an upper layer of the lightly doped drift region of the first conductive type semiconductor; an upper surface of the main junction of the second conductive type semiconductor, distant from a termination region, is provided with a source metal, and the source metal is in contact with the field oxide layer.

12. The junction termination with the internal field plate according to claim 11, wherein the main junction of the second conductive type semiconductor is in contact with the polysilicon layer through a contact hole.

13. The junction termination with the internal field plate according to claim 12, wherein the source metal extends along the upper surface of the field oxide layer to connect with the polysilicon layer, and connects a potential of a source to the polysilicon field plate.

14. The junction termination with internal field plate according to claim 12, wherein a buried layer of the second conductive type semiconductor is provided directly under the trench.

15. The junction termination with internal field plate according to claim 11, wherein a buried layer of the second conductive type semiconductor is provided directly under the trench.

16. The junction termination with the internal field plate according to claim 2, wherein in the active region of the device, the main junction of the second conductive type semiconductor in contact with the first semiconductor implantation region is arranged on an upper layer of the lightly doped drift region of the first conductive type semiconductor; an upper surface of the main junction of the second conductive type semiconductor, distant from a termination region, is provided with a source metal, and the source metal is in contact with the field oxide layer.

17. The junction termination with the internal field plate according to claim 16, wherein the main junction of the second conductive type semiconductor is in contact with the polysilicon layer through a contact hole.

18. The junction termination with the internal field plate according to claim 17, wherein the source metal extends along the upper surface of the field oxide layer to connect with the polysilicon layer, and connects a potential of a source to the polysilicon field plate.

19. The junction termination with internal field plate according to claim 17, wherein a buried layer of the second conductive type semiconductor is provided directly under the trench.

20. The junction termination with internal field plate according to claim 16, wherein a buried layer of the second conductive type semiconductor is provided directly under the trench.

* * * * *